US008021935B2

(12) United States Patent  
Mei et al.

(10) Patent No.: US 8,021,935 B2  
(45) Date of Patent: Sep. 20, 2011

(54) THIN FILM DEVICE FABRICATION PROCESS USING 3D TEMPLATE

(75) Inventors: Ping Mei, Palo Alto, CA (US); Hao Luo, San Jose, CA (US); Albert Hua Jeans, Mountain View, CA (US); Angeles Marcia Almanza-Workman, Sunnyvale, CA (US); Robert A. Garcia, Palo Alto, CA (US); Warren Jackson, San Francisco, CA (US); Carl P. Taussig, Redwood City, CA (US); Craig M. Perlov, San Mateo, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 276 days.

(21) Appl. No.: 12/243,073

(22) Filed: Oct. 1, 2008

(65) Prior Publication Data  
US 2010/0078640 A1  Apr. 1, 2010

(51) Int. Cl.  
*H01L 21/00* (2006.01)

(52) U.S. Cl. . 438/149; 438/670; 438/942; 257/E21.023; 257/E21.411; 257/E29.137

(58) Field of Classification Search .................. 438/149, 438/942, 552, 670; 257/E21.411; 247/E29.137  
See application file for complete search history.

(56) References Cited

U.S. PATENT DOCUMENTS

| 5,976,978 | A   | * | 11/1999 | Salisbury ..................... 438/690 |
| 6,861,365 | B2  |   | 3/2005  | Taussig et al. |
| 7,070,406 | B2  |   | 7/2006  | Jeans |
| 7,202,179 | B2  |   | 4/2007  | Taussig et al. |
| 7,341,893 | B2  |   | 3/2008  | Mei et al. |
| 7,696,088 | B2  | * | 4/2010  | Long et al. .................... 438/670 |
| 2005/0023557 | A1 | * | 2/2005 | Okada et al. .................. 257/199 |
| 2005/0176182 | A1 | * | 8/2005 | Me et al. ....................... 438/149 |
| 2006/0160278 | A1 | * | 7/2006 | Mei .................................. 438/149 |
| 2006/0275963 | A1 | * | 12/2006 | Mei et al. ..................... 438/160 |
| 2008/0111136 | A1 | * | 5/2008 | Qiu et al. ........................ 257/72 |
| 2008/0166838 | A1 | * | 7/2008 | Long et al. .................... 438/151 |
| 2008/0248605 | A1 | * | 10/2008 | Taussig et al. ................. 438/53 |

OTHER PUBLICATIONS

Erkhardt, Low-Teperature Fabrication of Si Thin film Transistor Microstructure by Soft Lithography Patterning on Curved and Planar substrates, Aug. 2000, pp. 3306-3315.*

* cited by examiner

Primary Examiner — Matthew Landau  
Assistant Examiner — Latanya N Crawford

(57) ABSTRACT

A fabrication process for a device such as a backplane for a flat panel display includes depositing thin film layers on a substrate, forming a 3D template overlying the thin film layers, and etching the 3D template and the thin film layers to form gate lines and transistors from the thin film layers. An insulating or passivation layer can then be deposited on the gate lines and the transistors, so that column or data lines can be formed on the insulating layer.

19 Claims, 10 Drawing Sheets

THIN FILM DEVICE FABRICATION PROCESS USING 3D TEMPLATE

BACKGROUND

Current flat panel displays such as LCD, LED, and electrophoretic displays generally include backplane circuitry for operation of picture elements or pixels that are arranged in rows and columns in the display. The backplane may, for example, implement an active matrix that is able to refresh an entire row of pixels at once. Such backplanes generally include an array of thin film transistors (TFTs), where one or more TFTs have their source or drain coupled to respective electrodes in a corresponding pixel. The TFTs for a row of pixels have gates coupled to a gate or row line corresponding to the row, and the TFTs corresponding to a column of pixels generally have their drains or sources coupled to a data or column line corresponding to the column.

Conventional integrated circuit processing techniques such as precision photolithography can be difficult to employ for fabrication of a backplane for a large display because of the large area covered and because materials commonly employed in the displays are flexible and difficult to keep flat over the large area. In general, fabricating a TFT requires at least three masking levels, and more masking levels may be needed to form the backplane of a display. Accurately aligning mask patterns against each level is difficult for flexible substrates which have poor dimension stability.

U.S. Pat. No. 7,202,179, entitled "Method of forming at least one Thin Film Device" describes fabrication processes using three-dimensional (3D) templates that can be imprinted on a large area such as the area of a flat panel display. Using these techniques, a 3D template is imprinted on top of a multilayer stack to be patterned. The 3D template generally has multiple levels, with each level corresponding to different thicknesses of the 3D template and a different underlying layer to be patterned. An anisotropic etching process can then thin the 3D template and etch through portions of the underlying layers that become exposed. The process etches deeper into the underlying layers where the 3D template was thinner. For example, the etch process may etch down through the bottom layer of a multi-layer stack where the 3D template was thinnest, but the other levels of the 3D template are thick enough that the portions of the bottom layer under other levels of the 3D template remain. After the process is complete, each layer of the multilayer stack is left with a pattern corresponding to the areas where the 3D template and overlying layers of the multilayer stack were thick enough to protect the layer.

An advantage of using a 3D template in manufacture of a backplane for a display is that the multiple layers of the stack that are patterned with a single 3D template are automatically aligned with each other. Further, roll-to-roll imprinting techniques can cover the large area of a display. Etching multiple layers with a 3D template does have difficulty when producing signal lines or other structures that cross in different layers. For example, the row lines and data lines of a conventional backplane cross each other, so that a conventional fabrication process using 3D templates requires an undercut process (e.g., a wet etch process) to remove portions of the row or data line that are under portions of the data or row lines.

In order to realize high yield manufacturing processes, methods for fabricating a backplane for a display that efficiently align overlying layers and that provide low defect rates are desired.

SUMMARY

In accordance with an aspect of the invention, a device fabrication process includes depositing thin film layers on a substrate, forming a 3D template overlying the thin film layers, and etching the 3D template and the thin film layers to form gate lines and transistors from the thin film layers. An insulating or passivation layer can then be deposited on the gate lines and the transistors, so that column or data lines can be formed on the insulating layer. The gate lines are respectively coupled to rows of the transistors, and the column lines are respectively coupled to columns of the transistors.

Another embodiment of the invention is a system such as a flat-panel display or a backplane for a flat panel display. The system includes a self-aligned structure, a passivation layer overlying the self-aligned thin-film structure, and conductive traces on the passivation layer. The self-aligned structure includes gate lines and rows of thin-film transistors that are respectively gated by the gate lines. The conductive traces are subject to alignment variations relative to the self-aligned structure and include data lines that cross over the gate lines. Each of the data lines is coupled to a column of the thin-film transistors.

BRIEF DESCRIPTION OF THE DRAWINGS

Use of the same reference symbols in different figures indicates similar or identical items.

DETAILED DESCRIPTION

Figure 1:
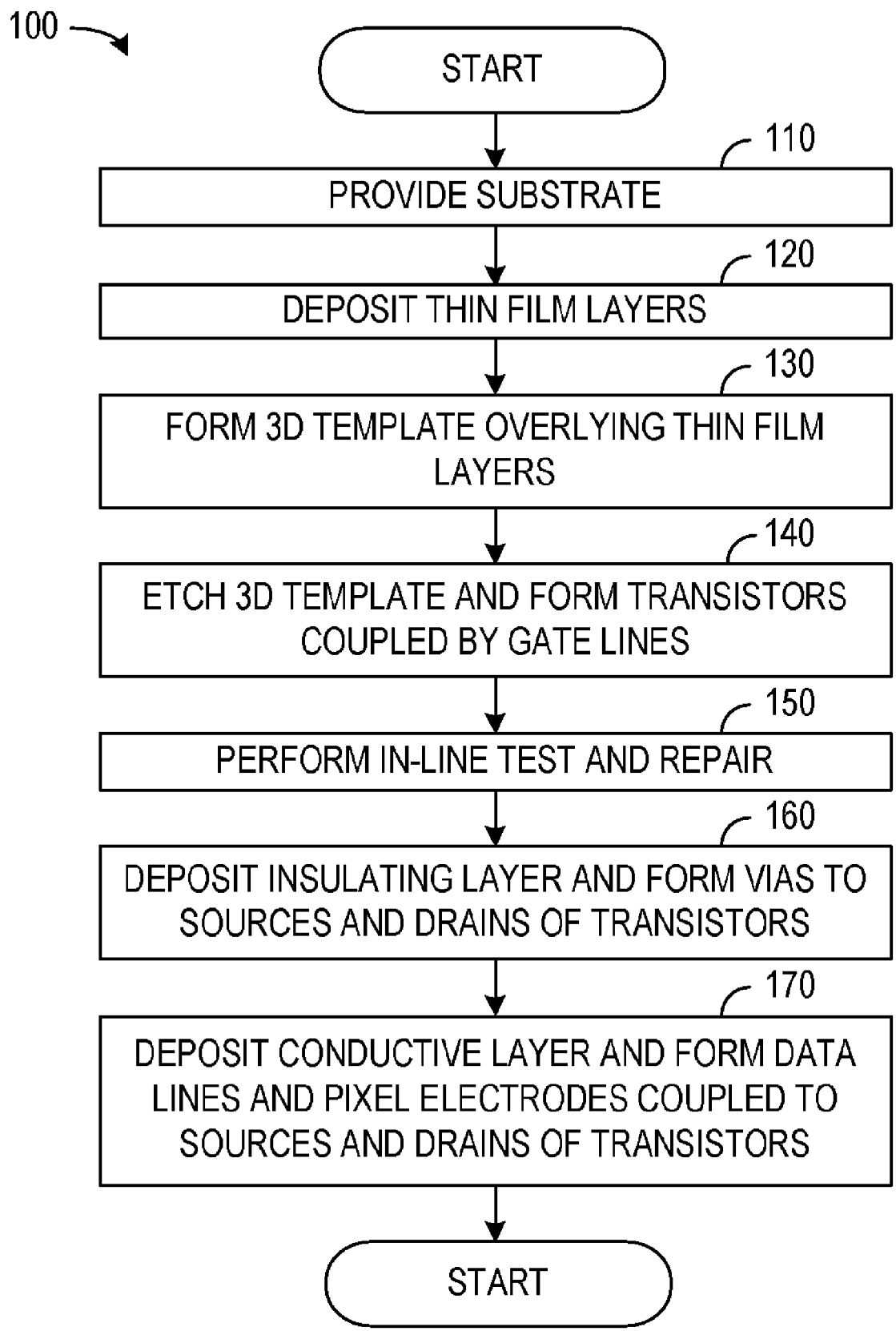
FIG. 1 is a high level flow diagram of a process for fabricating a backplane in accordance with an embodiment of the invention.

In accordance with an aspect of the current invention, a fabrication process for circuitry such as a backplane having crossing signal lines can employ Self-Aligned Imprint Lithography (SAIL) for fabrication of circuit structures that require precisely controlled alignment and tolerances and still avoid the need for underetching. FIG. 1 is a high level flow chart of an exemplary process 100 for forming a backplane in accordance with an embodiment of the invention. Fabrication of a backplane is described here as an illustrative example, but fabrication of other thin-film circuits having crossing signal lines could also benefit from use of the techniques illustrated in FIG. 1. A first step 110 of process 100 is providing a substrate. Generally, displays employ a rigid or flexible substrate that serves as a base for the backplane. Thin film device layers are then deposited upon the substrate in step 120.

Steps 130 and 140 utilize a SAIL process to form thin-film devices on the substrate. The SAIL process uses a resist, polymer, or similar material that is imprinted to form a 3D template. As the template material is flexible, the 3D template can stretch or distort to the same degree as the substrate even when the substrate is flexible. As such, a SAIL roll-to-roll imprinting/fabrication process may be employed to provide low cost manufacturing solutions for devices such as flat and/or flexible displays, or other devices suitable for roll-to-roll processing. Process 100 may also be employed upon a non-flexible substrate, while remaining within the spirit and scope of at least one embodiment.

Step 130 is the imprinting of the 3D template on the thin film device layers formed in step 120. The thin film device layers and the 3D template structure are then selectively etched in step 140. This etching forms the rudimentary structure for a TFT array or other circuitry to be fabricated. The rudimentary structure for the backplane of a display includes multiple rows of TFTs. TFTs in a row can share a gate line, with the channel width of each TFT being approximately aligned with the gate line. The source and drain of each TFT are electrically isolated from the neighboring TFTs. Optionally, each row of the TFTs may have a continuous gate dielectric strip that underlies the TFTs in the row.

Step 150 performs an in-line test and defect repair of TFTs of the thin-film circuit structure after the SAIL process but before fabrication of overlying layers. The in-line test can test for shorting of signal lines, e.g., gate lines and common lines, formed during the SAIL process. Identified shorts may then be repaired, for example, using laser cutting.

Step 160 deposits an insulating layer on the rudimentary structure tested in step 150. Via holes through the insulating layer are then formed to expose contacts of the sources and drains of TFTs. Step 170 then deposits a conductive layer on the insulating layer for formation data lines and an array of pixel electrodes connected to TFT drains and sources, respectively.

The gates of TFTs in an array fabricated using processes described herein can be aligned with small area channel regions using a self-aligned process, and channel lengths can be defined with precision. The contacts of sources and drains of the TFTs can be made relatively large, so that alignment tolerances for data lines and contacts to electrodes are similarly large. The relatively large alignment tolerances allow the data lines, which cross the gate lines, to be fabricated separately, for example, using conventional techniques such as step-and-repeat photolithography, template imprinting, or trace printing techniques. Fabrication processes described here also advantageously allow thin film layers to be deposited onto flexible or non-flexible substrates prior to any patterning step and therefore can minimize the number of processing steps and reduce processing related contamination to the device layer. In addition, the present methods provide opportunities for performing in-line TFT testing and repairing, therefore improving manufacturing yield of backplanes. Furthermore, the device structure produced by the present method isolates possible shunt defects in the device layers thereby improving backplane performance and quality.

Figure 2A:
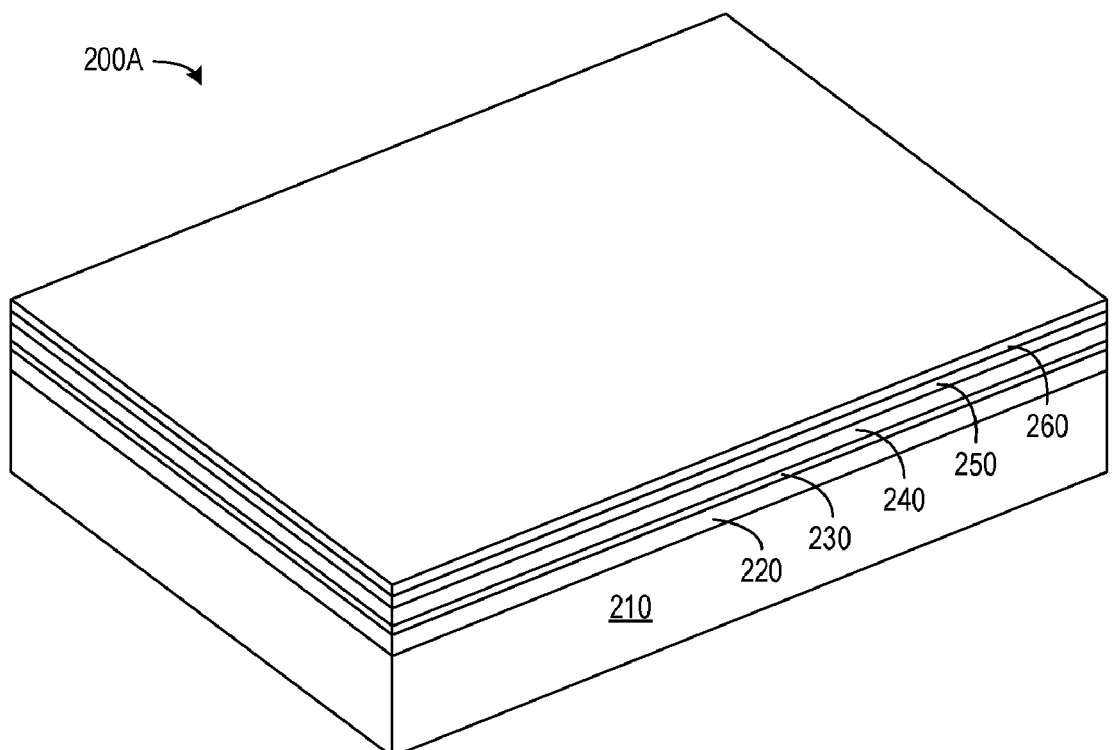
FIGS. 2A, 2B, 2C, and 2D show perspective views of structures created during a fabrication process for the backplane circuit in accordance with an embodiment of the invention.
Figure 2B:
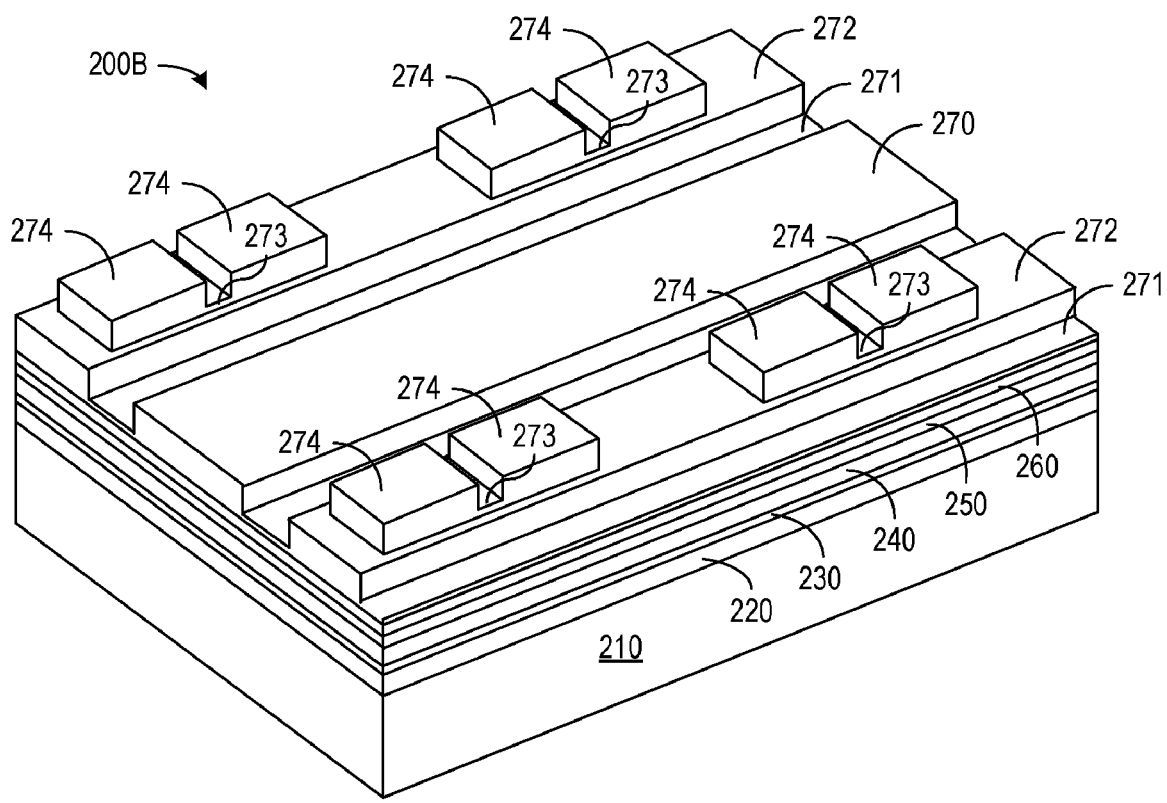
Figure 2C:
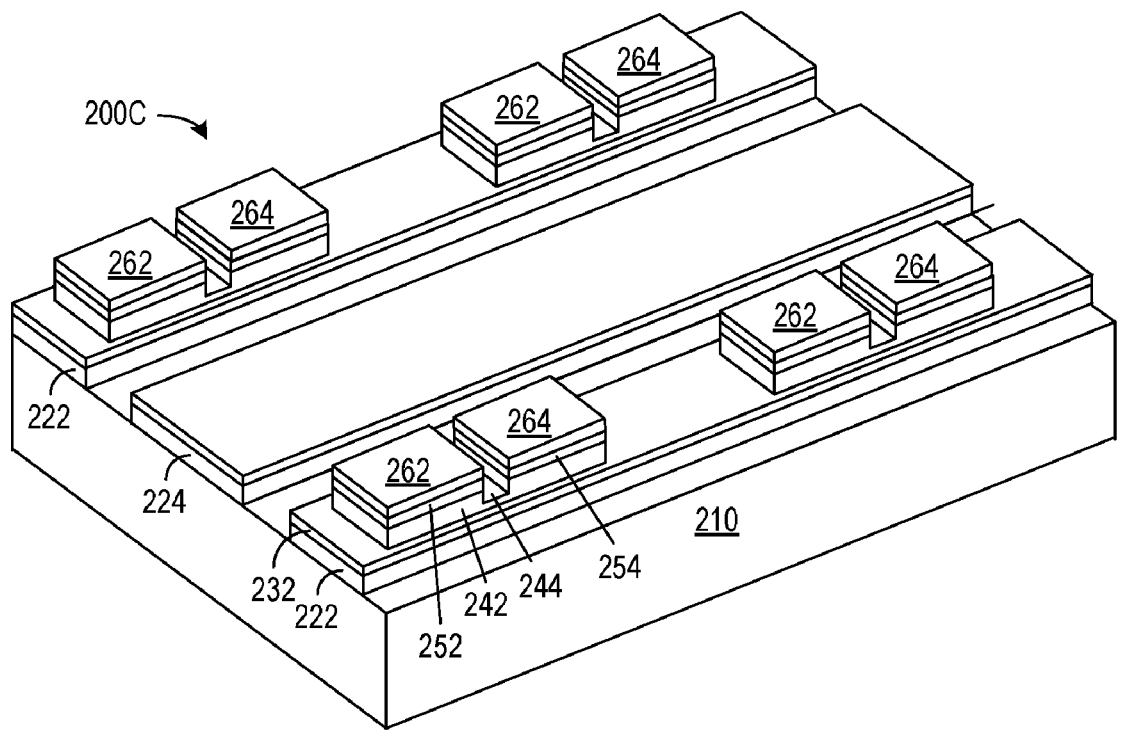
Figure 2D:
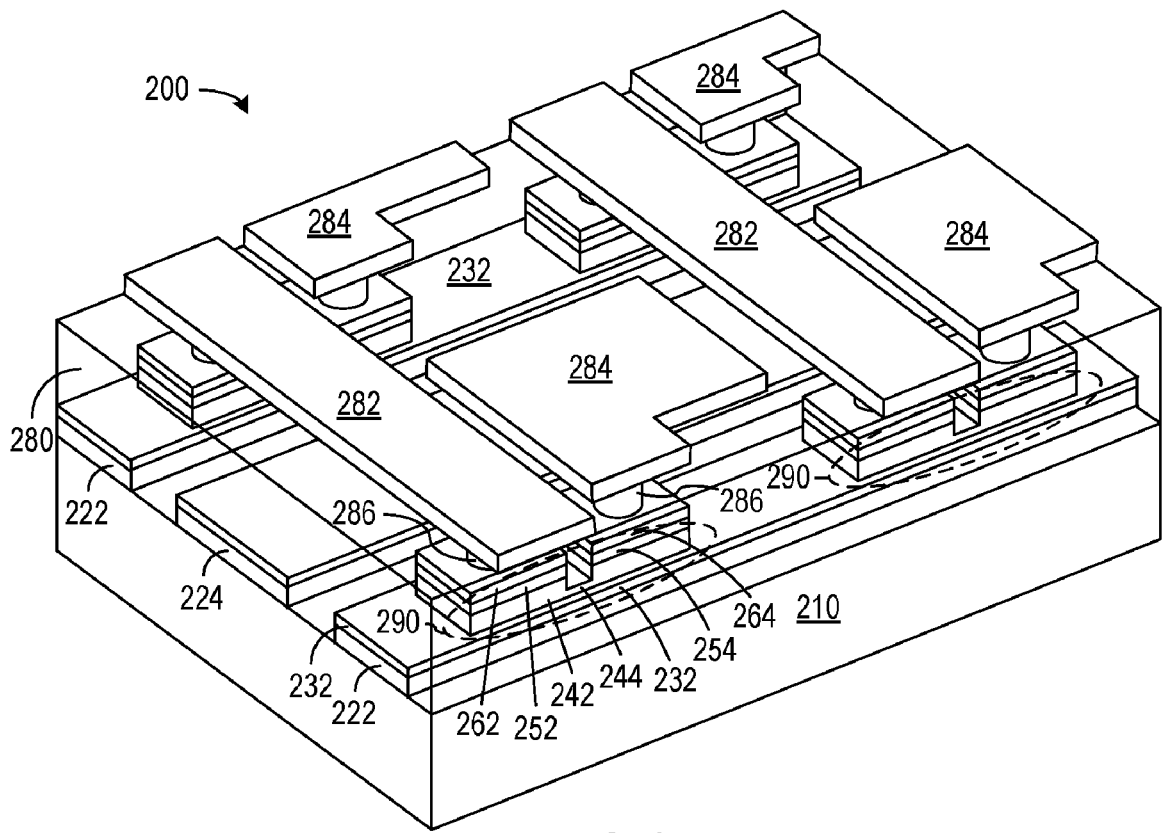

FIGS. 2A, 2B, 2C, and 2D illustrate structures created during fabrication of a portion of backplane 200 in accordance with an exemplary embodiment of the invention. FIG. 2D, in particular, shows the completed portion of backplane 200. Backplane 200 can be a flexible circuit that includes an array of thin film devices 290 that are used in operation of a display. A full version of backplane 200 would typically contain hundreds to thousands of row and columns of TFTs 290 with the number of devices 290 being determined by the number of pixels in the display. Backplane 200 more specifically includes conductive row or gate lines 222 and ground or common lines 224 on a supporting substrate 210. A gate dielectric such as silicon nitride or other gate dielectric layer 232 on gate lines 222 is between gate lines 222 and respective thin film regions of TFTs 290. Each TFT 290 includes a body region 242 (e.g., an N-type semiconductor region for an N-channel transistor) including a channel region 244 and drain and source regions 252 and 254. Metal drain and source contacts 262 and 264 provide pads for conductive vias 286 that pass through a passivation layer 280 for electrical connections to drain and source regions 252 and 254. Data lines 282 and pixel electrodes or contacts 284 are on an insulating passivation layer 280 that protects the underlying gate lines 222 and TFTs 290. Conductive vias 286 through passivation layer 280 electrically connect each data line 282 to drains 252 of TFTs 290 corresponding to a column of pixels and electrically connect electrodes 284 to sources 254 of individual TFTs 290.

The size of pixels in a display incorporating backplane 200 dictates the spacing of gate lines 222 and data lines 282. A typical pixel pitch for displays of 72 dpi (dot per inch) is on the order of about 350 µm. In contrast, the dimensions of TFTs 290 are selected according to desired switching performance. In general, a higher ratio of TFT channel width to channel length results in a higher channel current and faster pixel switching speed.

Backplane 200 can be fabricated using conventional techniques to pattern gate lines 222 and common lines 224 prior to material depositions for gate dielectric and thin film semiconductor layers for TFTs 290. For example, photolithography processes can be used to mask and etch a bottom conductor layer and form gate lines 222 and common lines 224. However, the surface of the patterned gate lines 222 and common lines 224, as well as the exposed portions of substrate 210 would have to be cleaned well for the deposition of a stack of device layers thereon. Further, alignment of gate lines 222 with overlying structures can suffer when a bottom conductor/metal layer is patterned to form gate lines 222 before deposition of gate insulators and thin films that form body regions 242 and drain and source regions 252 and 254. A process in accordance with an exemplary embodiment of the invention for fabricating backplane 200 as illustrated in FIGS. 2A, 2B, and 2C deposits thin film layers for TFTs 290 on an unpatterned bottom conductor layer and uses a 3D template to simultaneously form gate lines 222 and TFTs 290. Passivation layer 280 can then be deposited, and structures such as data lines 282 and pixel contacts 284, which are more tolerant of alignment errors, can be formed on passivation layer 280 using more conventional techniques for forming conductive traces.

Details of an exemplary fabrication process for backplane 200 are described here with reference to the perspective view of FIGS. 2A, 2B, and 2C and the cross-sectional view of FIGS. 3A through 3M. In the exemplary embodiment, backplane 200 is built with a-Si:H TFT materials on a polyimide web. However, other thin-film devices such as organic semiconductor devices could be similarly employed.

FIG. 2A shows an intermediate structure 200A including an unpatterned multilayer stack formed on substrate 210. Substrate 210 can be any supportive insulating structure having the characteristics desired for the display to include backplane 200. However, in an exemplary embodiment, substrate 210 is a flexible polyimide substrate having a thickness of about 1 to 5 mil. A conductive layer 220 can be deposited on substrate 210 using conventional techniques such as chemical vapor deposition, sputtering, spraying, or printing. In the exemplary embodiment, conductive layer 220 is a metal such as aluminum about 50 nm to 200 nm thick and is on an adhesion layer such as a silicon nitride layer on substrate 210. An insulating layer 230, which will serve as a gate dielectric layer, is deposited on conductive layer 220. In an exemplary embodiment, insulating layer 230 is a silicon nitride layer about 200 nm to 400 nm thick.

Layers 240 and 250, which will form the bodies, sources, and drains of TFTs 290, are thin film semiconductor layers. For example, for N-channel transistors, layer 240 can be an intrinsic hydrogenated amorphous silicon (a-Si:H) layer, and layer 250 can be an a-Si:H layer with heavy N-type (e.g., phosphorous) doping. A layer 260, which is deposited on thin-film semiconductor layer 250, is a conductive layer that will be used to form drain and source pads. For example, layer 260 can be a chromium layer about 50 nm to 200 nm thick. Deposition of layers 240, 250, and 260 can be performed using a roll-to-roll plasma enhanced chemical vapor deposition (PECVD) and metal deposition system.

Figure 3A:
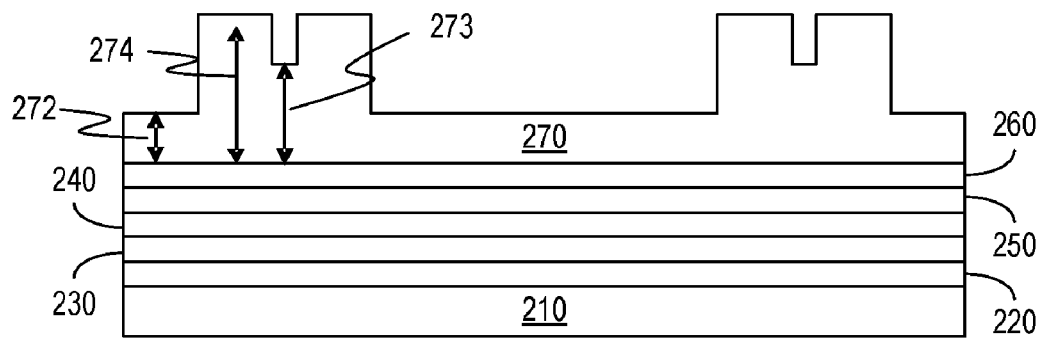
FIGS. 3A, 3B, 3C, 3D, 3E, 3F, 3G, 3H, 3I, 3J, 3K, 3L, and 3M show cross-sectional views of intermediate structures during a fabrication process for the backplane circuit in accordance with an embodiment of the invention.
Figure 3B:
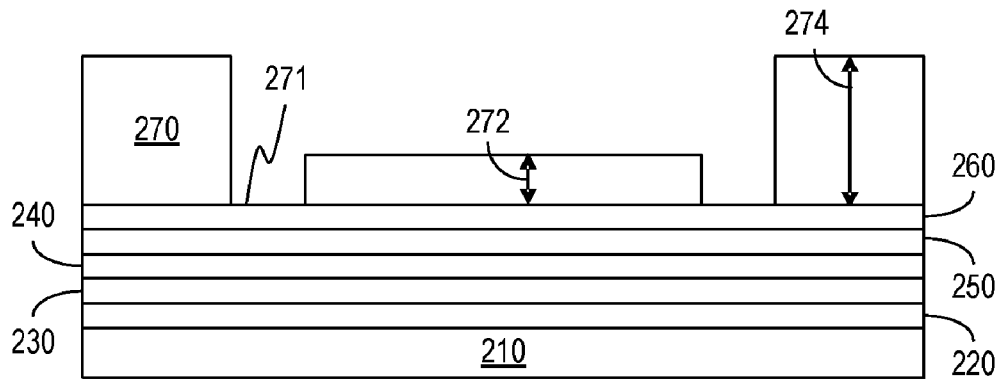

FIG. 2B shows an intermediate structure 200B created after a 3D template 270 is imprinted using a polymer material on the multilayer stack 200A of FIG. 2A. FIGS. 3A and 3B show cross-sectional views of structure 200B respectively along a cross-section that is along gate line direction and a cross-section that is along data line direction. Structure 270 can be fabricated using a roll-to-roll Self-Aligned Imprint Lithography (SAIL) process that is able to produce multilevel templates on flexible substrates. U.S. Pat. No. 6,861,365, entitled "Method and System for Forming a Semiconductor Device" describes the general SAIL process and is hereby incorporated herein by reference. The SAIL process generally includes depositing a layer of an uncured polymer or resist material and applying a stamping tool to cure and shape the layer. When the desired shape of the layer is a repetitive 3D template, the stamping tool can include a roller that can roll against a flat surface of a flexible or rigid substrate coated with resist or the surface of a coated flexible material being fed through a reel and roller system. The 3D resist can be cured or hardened.

FIGS. 2B, 3A, and 3B show an embodiment of 3D template 270 having four levels 271, 272, 273, and 274 left by the imprinting process. Level 271 is the lowest and thinnest level that results and corresponds to a thin layer of imprinted polymer that is residual on the thin film layers. Typically, the thickness of the polymer residual can be less than 100 nm. The area at level 271 corresponds to separations between gate lines 222 and the pixel common lines 224 to be formed from layers 220 and 230. Level 272 is the next higher level, about 0.5 to 2 μm, and defines areas around TFTs 290 and the pixel electrodes. Level 273, which is the next higher level of template 270, defines the TFT channels. Level 273 can be about 0.5 μm to 2 μm higher than level 272. Level 274 is the highest level of structure 270 and defines the TFT drain and source regions 252 and 254. Level 274 can be about 0.5 μm to 2 μm higher than level 273. Alternative embodiments of structure 270 can employ additional levels. For example, the area at level 272 may be split into two sub-levels to separately define pixel areas and TFT isolation to create different thicknesses of the dielectric for the TFT gates and pixel storage capacitors.

Figure 3C:
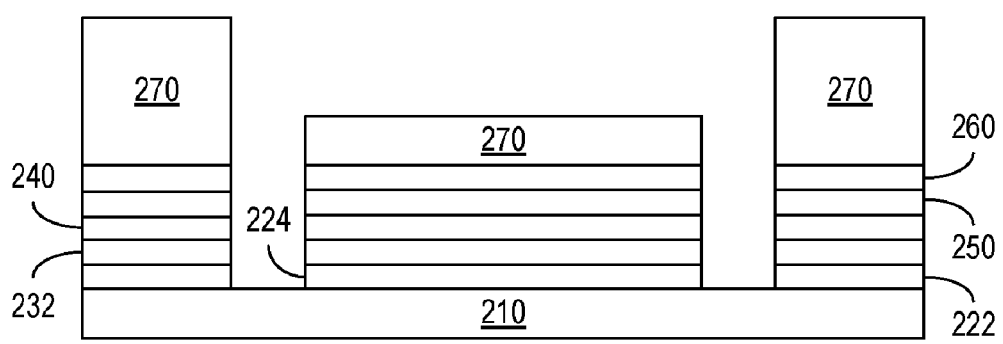
Figure 3D:
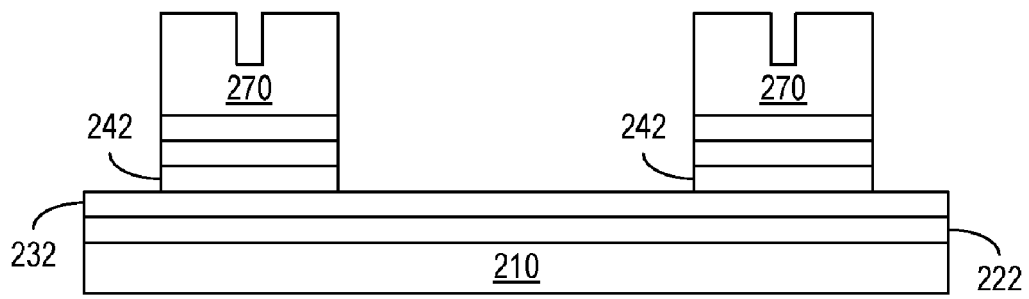
Figure 3E:
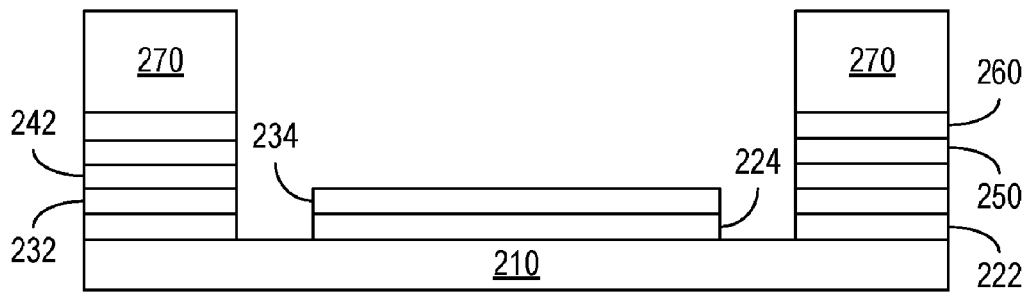
Figure 3F:
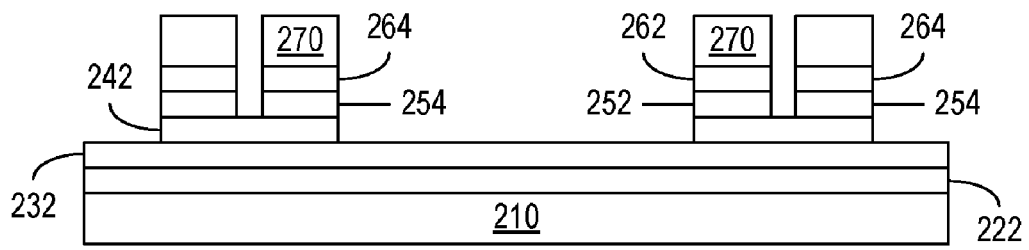
Figure 3G:
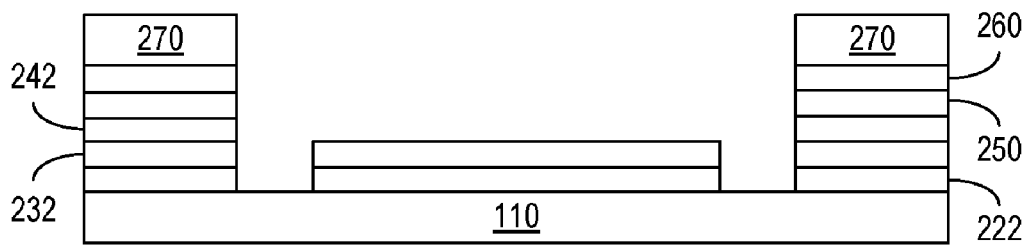

An etch process using 3D template 270 generally involves thinning of 3D template to expose underlying layers and the etching the exposed layers using the remaining portions of 3D template 160 as a mask. More specifically, in the embodiment of FIG. 2B, 3D template 270 is initially thinned, for example, using an anisotropic etch process, so that portions of 3D template corresponding to level 271 are removed, which exposes areas of layer 260. Using the same or a different etch chemistry, the exposed portion of layer 260 (e.g., chromium metal), semiconductor layer 250 (doped a-Si), semiconductor layer 240 (intrinsic a-Si), gate dielectric layer 230 (silicon nitride), and conductive layer 220 (aluminum) are etched away. As shown in FIG. 3C, which is a cross-sectional view along the data line direction, this initial etching step forms gate lines 222 and common lines 224, which are isolated from gate lines 222. Common lines 224 can be connected together outside of the array (not shown).

An etch process is performed to thin 3D template 270 by one step height, thereby exposing areas of layer 260 corresponding to common lines 224 and portions of gate lines 222 that between two neighboring TFTs 290. The exposed layer 260 and underlying portions of layers 250 and 240 are then etched away as shown in the cross-sectional views along the gate line and data line directions respectively in FIGS. 3D and 3E. The remaining portions of layer 240 then form the body regions 242 of the TFTs.

Figure 3H:
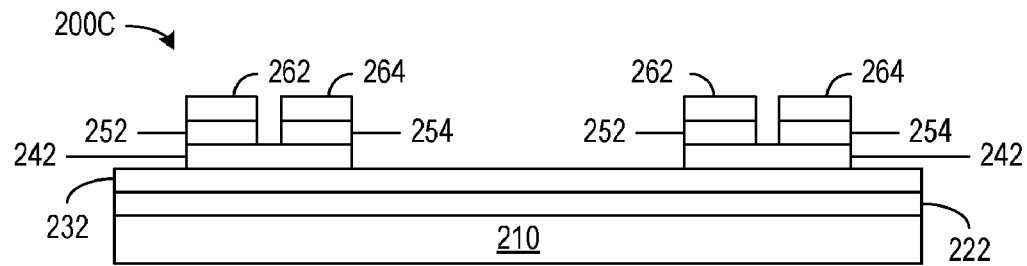
Figure 3I:
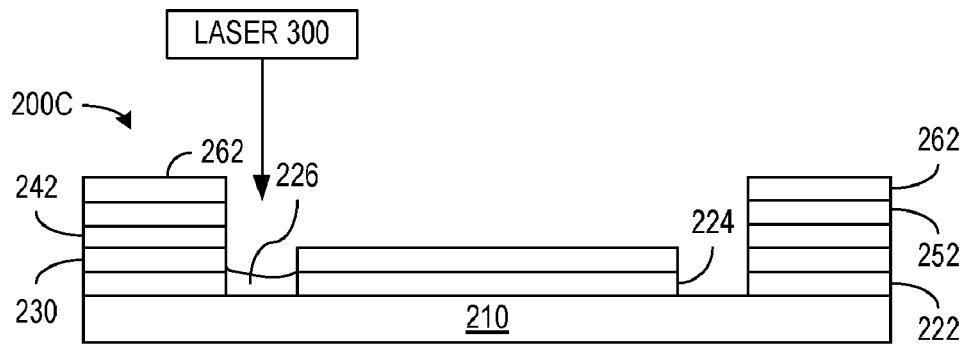

Thinning 3D template 270 again leaves regions of template over areas corresponding to the drain and sources of the TFT and exposes layer 260 in areas corresponding to the TFT channel 244. An etch process then removes the exposed portions of layer 260 and doped Si 250 as shown in the cross-sectional views along the gate line and data line directions respectively in FIGS. 3F and 3G, but this etch is of a controlled duration to leave channel regions 244. After removing the remaining portions of 3D template 270, which were on drain and source contacts 262 and 264, TFTs 290 are above gate lines 222. FIGS. 2C, 3H, and 3I respectively show a perspective view, a cross-sectional view along the gate line direction, and a cross-sectional view along the data line direction of the structure 200C that remains after final removal of 3D template 270 from the structure of FIGS. 3F and 3G.

According to one embodiment, an in-line test and defect repair process can be performed on structure 200C. One common defect is a short between gate lines 222 and common lines 224 caused by an imprint defect, particle contamination, or a non-uniform etching process. One such defect results in an entirely defective row in a display. It is therefore desirable to identify and remove the shorts before further processing. An in-line test can automatically probe conductance between each gate line and the common lines. An identified short 226 as shown in FIG. 3I can be removed by a laser tool 300 such as a pulsed YAG or excimer laser.

Figure 3J:
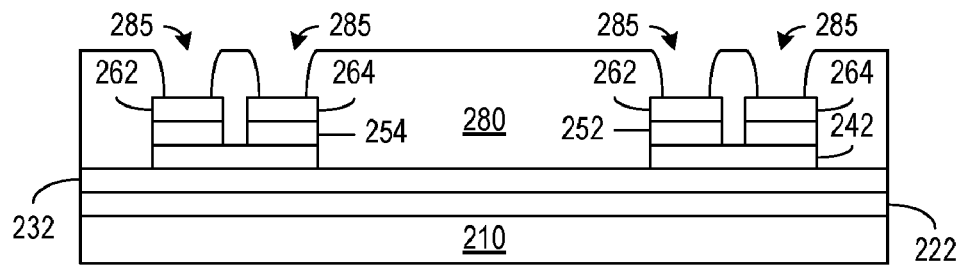
Figure 3K:
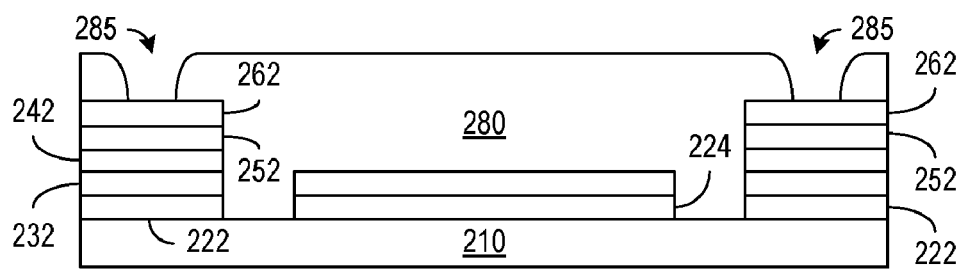

Referring now to FIGS. 3J and 3K, which respectively show cross-sectional views along the gate line and data line directions, a layer 280 of passivation material is deposited to cover intermediate structure 200C of FIGS. 2C, 3H, and 3I. Passivation layer 280 can be an organic material such as DOW Cyclotene, FujiFilm polyimide, and Honeywell PTS-E or an inorganic film such as oxynitride plasma deposited at a low temperature. Passivation layer 280 protects underlying TFTs 290 from moisture contamination and mechanical damage. Passivation layer 280 also buffers data lines 282 from capacitive coupling to gate lines 222. Electrical connection of data lines 282 and pixel electrodes 284 to drain and source pads 262 and 264 require via holes 285 through passivation layer 280. Metal or other conductive material that forms data lines 282, pixel electrodes 284, and conductive plugs 286 as shown in FIG. 2D can be formed on passivation layer 280 after the formation of via holes 285.

Various techniques such as photolithography, imprint lithography, direct laser writing/ablation, ink-jetting, and screen printing may be used to form via holes 285 and conductive traces, and in general, the technique used will depend on the required device dimension and alignment tolerance. In one embodiment, photoimageable Cyclotene, polyimide, or PTS-E may be used as the passivation material in layer 280. Photolithography or laser writing can then be used to define vias to drain and source pads 262 and 264. In another embodiment, passivation layer 280 is planarized over polymer pillars that were imprinted on drain and source regions 252 and 254 during the SAIL imprint process. The pillars are then removed, for example, using a solvent selected to dissolve the pillars. In yet another alternative process, the pillars used to define via holes 285 through passivation layer 280 can be remnants of 3D template 270 that are left after the etch process described above.

Figure 3L:
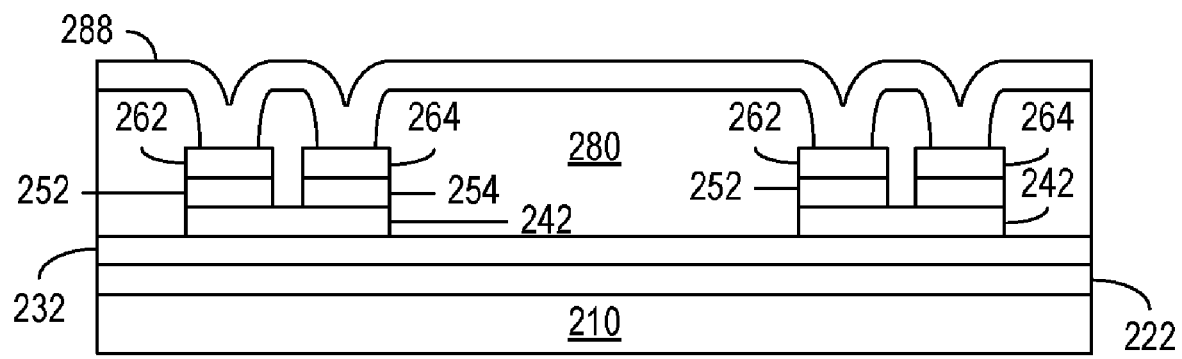
Figure 3M:
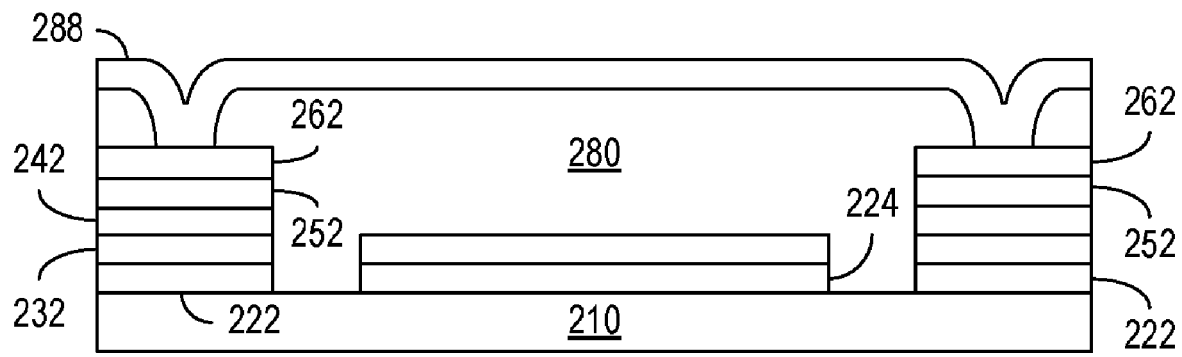

FIGS. 3L and 3M show cross-sectional views respectively along the gate line and data line directions and illustrate a conductive layer 288 such as aluminum that is deposited over passivation layer 280. Backplane 200 of FIG. 2D can be completed by patterning conductive layer 288 and forming data lines 282 and pixel electrodes 284 on passivation layer 280. Since the alignment tolerance for patterning of layer 288 is relatively large, e.g., on the order of about 10 μm, screen printing or a low resolution photolithography process are suitable for formation of data lines 282 and electrodes 284 even though such processes may not be able to achieve the line width or alignment tolerances required when defining the channels of the TFTs 290.

In the embodiment of backplane 200 of FIG. 2D, pixel electrodes 284 minimize overlap with gate lines 222, but if passivation layer 280 is sufficiently thick, pixel electrodes 284 could extend over gate lines 222 without having a capacitive coupling problem, which can significantly improve the pixel fill factor, e.g., the percentage of the area of the display covered by optically active pixel area.

Further defect repair may be performed before forming top conductive layers or after completing a display backplane to improve array performance and production yield. A common defect is a shunt defect caused by pin holes in the gate dielectric layer 230. The defect leads to a leakage path between the bottom gate metal and source/drain metal and has been one of the major problems in producing TFT backplanes. However, in backplane 200, passivation layer 280 can be made sufficiently thick to practically eliminate direct shunt defects that are away from TFTs 290. As a result, the number of defects at the array level can be greatly reduced in backplane 200, and most shunt defects can be limited to the crossover area between gate lines 222 and data lines 282. In particular, most shunts may be due to defects in the gate dielectric 232 in TFTs 290. Improving the quality of the dielectric material is important to minimizing this problem, and as noted above with reference to FIG. 2A, forming gate dielectric 230 on a planar unpatterned layer 220 can improve the quality of gate dielectric 230. However, a few shunts in gate dielectric layer 232 in backplane 200 may result from defects such as pin holes in gate dielectric layer 232.

Figure 4A:
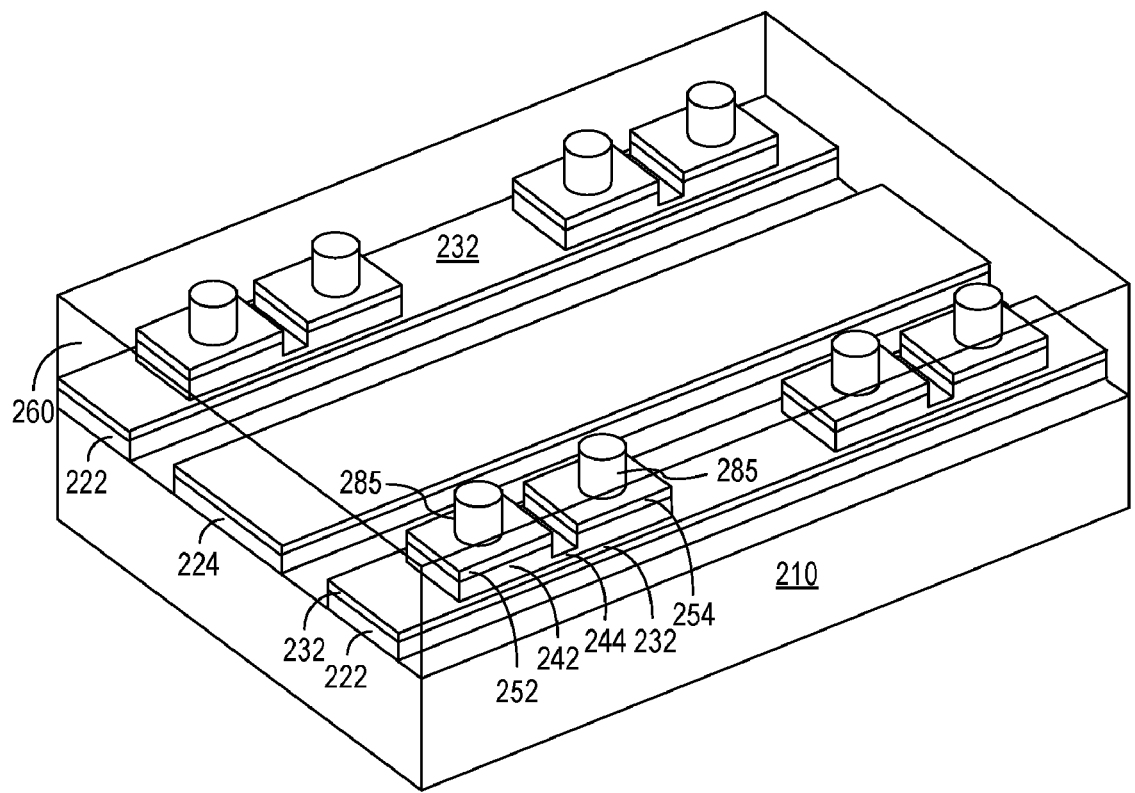
FIGS. 4A and 4B illustrate structures suitable for defect repair processes in a backplane in accordance with an embodiment of the invention.

A single shunt located below a data line in some convention backplane circuits causes a failure of the entire data line and the corresponding column of pixels. However, backplane 200 of FIG. 2D allows for defect repair during the fabrication process to isolate defective crossovers and save the column of pixels. For example, once a shunt defect is identified during the in-line test process as described earlier, the defective TFT 290 can be sealed by jetting a polymer to fill those via holes 285 on the intermediate structure of FIG. 4A or 3J. Overlying conductive traces can then be formed as described above, but no connection to the defective TFT 290 will be created because via holes 285 associated with the defect are filled with an insulating material.

Figure 4B:
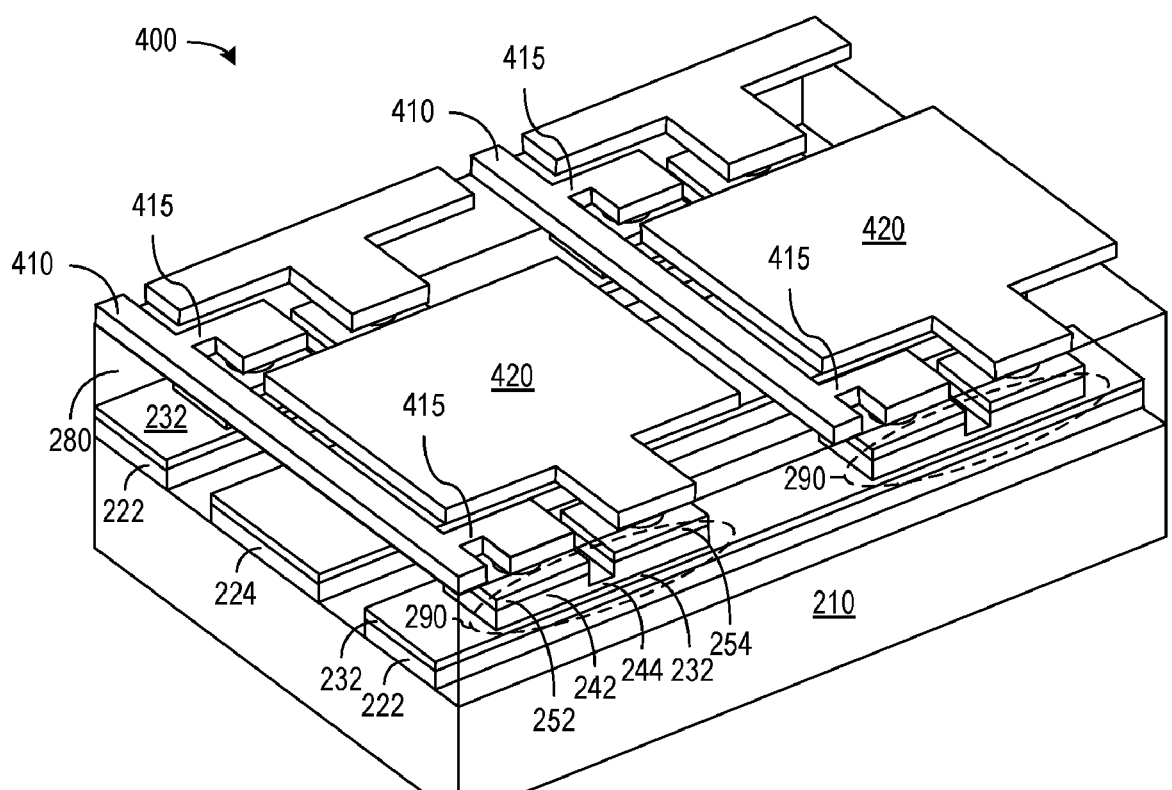

An alternative method for isolating a defective crossover can be directly applied to backplane 400 of FIG. 4B. Backplane 400 contains structures that can be identical to those of backplane 200 of FIG. 2D, except that backplane 400 has data lines 410 and pixel electrodes 420 that are shaped differently from data lines 282 and 234 of backplane 200. In particular, the shape of data lines 410 provides necks 415 between respective drains 252 and continuous portions of data lines 410. When a crossover defect is detected in a particular TFT 290, the neck 415 that leads to the drain 252 of that TFT 290 can be cut with a laser to isolate the defect from the rest of the continuous data line 410.

The above repair methods minimize the number of defective display rows and columns. Redundant TFTs may be designed for each pixel for further reduction of the effects of single-pixel defects.

Backplanes described above have drains and sources 252 and 254 that are above gate lines 222. The overlap of gate lines 222 and drain/source regions 252 and 254 may raise a concern about source-gate and drain-gate parasitic capacitance. In general, the parasitic capacitance can cause voltage drops. However, as long as the required addressing speed is low or the overlap area is small enough so that the parasitic capacitance is negligible compared to the pixel capacitance, the performance of a backplane with drains and sources overlapping the gate lines should be suitable for video display applications.

Figure 5:
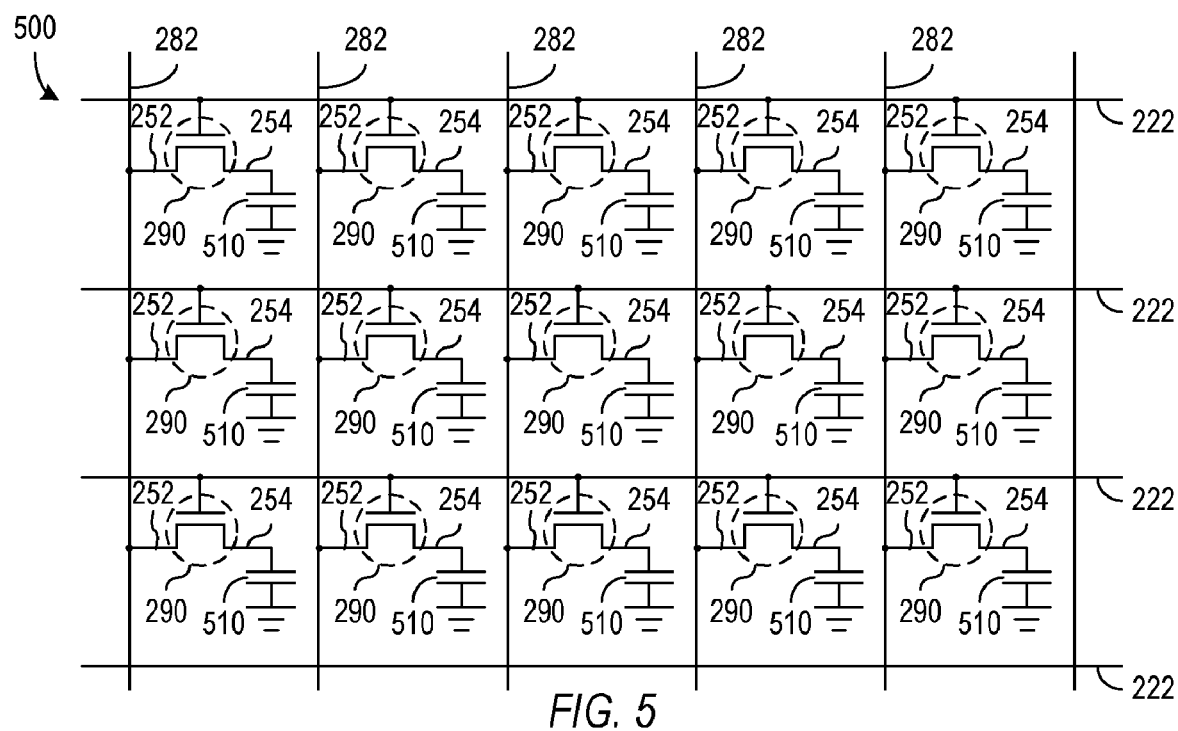
FIG. 5 is a circuit diagram for a display such as an LCD or electrophoretic display employing a backplane containing TFT circuitry in accordance with an embodiment of the invention.

FIG. 5 is a circuit diagram of a portion of a display 500 that can incorporate a circuit such as backplane 200 of FIG. 2D or backplane 400 of FIG. 4B. As illustrated in FIG. 5, each TFT 290 has a gate coupled to the gate line 222 for the row containing the TFT 290, a drain 252 coupled to a data line for the column containing TFT 290, and a source 254 coupled to a pixel 510. Each pixel 510 can use any desired structure that produces a suitable optical effect that varies with a voltage that TFT 290 applies to pixel 510. For example, in a reflective LCD display, pixel 510 would typically include: a reflective back electrode 284; a transparent front electrode, e.g., an Indium Tin Oxide electrode; at least one polarizing filter, and a liquid crystal material between the electrodes. A color filter, e.g., a filter that transmits red, green, or blue light can be included in each pixel 510 of a color display. As is well known in the art, LCD displays use the birefringence of the liquid crystal material to alter the polarization of traversing light and change the amount light of transmitted through or reflected from the pixel. For example, the thickness of the liquid crystal material (and the orientation of the polarizing filter or filters) can be selected so that when no voltage is applied, each pixel 510 has highest reflectivity. More specifically, light entering through the front polarizing filter is linearly polarized, and the liquid crystal material rotates that polarization so that the light reflected back through the polarizing filter passes through with little or no absorption. When TFT 290 applies a voltage from the attached data line 282 to the pixel electrode 284, the alignment or structure of the liquid crystal material changes, and the effect of the liquid crystal material on the polarization of traversing light changes so that more of the light is absorbed by the polarizing filter or filters. Near total absorption can be achieved when the liquid crystal material changes the polarization of the light so that the reflected light has a polarization perpendicular to the polarization axis at the front polarizing filter.

Pixel 510 can alternatively employ other technologies that change the optical properties as desired in a display. For example, pixel 510 can be an electrophoretic pixel. In an electrophoretic pixel, the electric field created by a voltage that TFT 290 applies to an electrode of the electrophoretic pixel moves an electronic ink (e.g., dark colored particles) toward or away from a light color reflective surface or particles. As a result, the pixel can appear light or dark depending on whether reflective surface of pixel 510 is dominated by light or dark colored particles.

Figure 6:
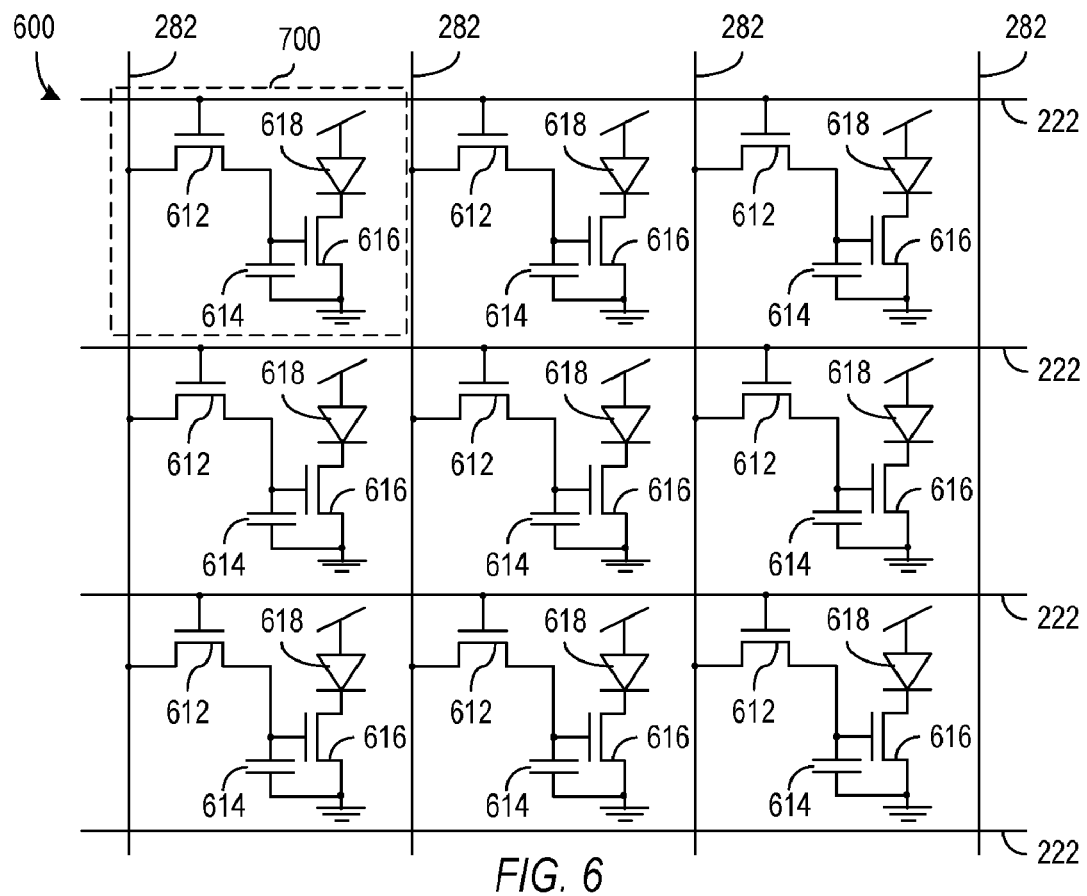
FIG. 6 is a circuit diagram for a LED display employing a backplane containing TFT circuitry in accordance with an embodiment of the invention.

The structure and processing techniques described above have been illustrated using the example of a backplane containing a TFT array. Embodiments of the invention can be integrated in other types of devices or contain more complex circuitry in a backplane. For example, a backplane for an LED display could be fabricated using above described techniques. FIG. 6 is a circuit diagram for an embodiment of an LED display 600. LED display 600 includes gate lines 222 and data lines 282 that cross each other and can be fabricated using the processes described above. Coupled to gate lines 222 and data lines 282 are select transistors 612, which can be TFTs fabricated in the same manner as TFTs 290 described above. The circuitry for each pixel in display 600 further includes a storage capacitor 614, a drive transistor 616, and an LED 618. In the circuitry for a single pixel, select transistor 612 is between data line 282 and storage capacitor 612, so that when the gate line 222 attached to the select transistor 612 is asserted, select transistor 612 charges storage capacitor 614 to the voltage on data line 282. Storage capacitor 614 is coupled to the gate of drive transistor 616, which is connected in series with LED 618 between a supply voltage and ground. Accordingly, the voltage on storage capacitor 614 controls the current flowing through drive transistor 616 and LED 618, and therefore controls the intensity of light that LED 618 emits.

Figure 7:
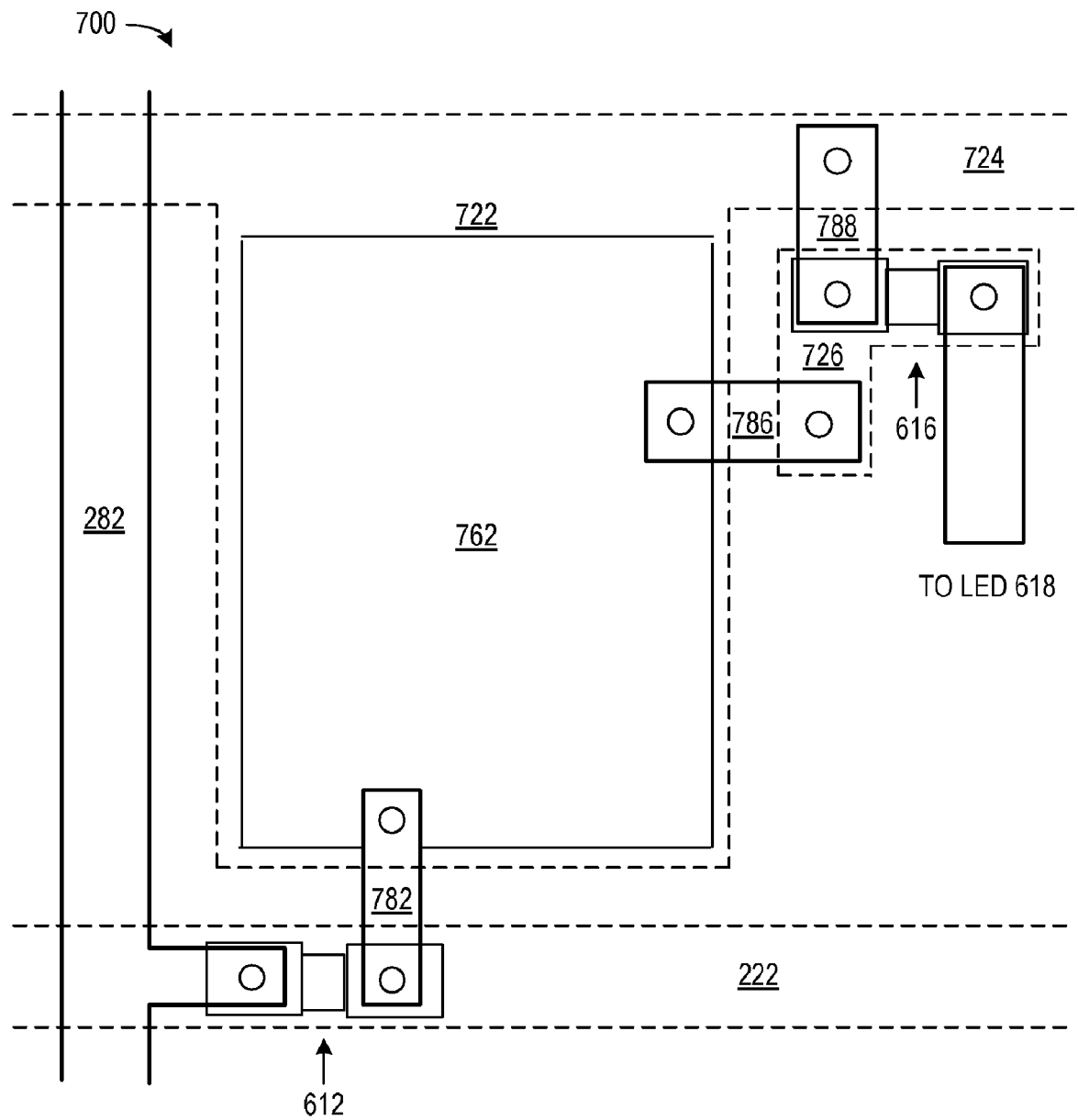
FIG. 7 shows a layout for a portion of a backplane corresponding to a pixel in an LED display in accordance with an embodiment of the invention.

Display 600 can be fabricated using a thin film stack and a 3D template as described above to form gate lines 222 and arrays of transistors 612 and 616 as TFTs. FIG. 7 shows a layout for multiple layers forming circuitry in a pixel 700 for LED display 600. In the embodiment of FIG. 7, a gate line 222, the lower plate 722 of capacitor 614, a ground line 724, and a lower plate 726 for the gate of TFT 616 are formed from bottom conductive layer during a SAIL process (e.g., steps 120 to 140 of FIG. 1.) The SAIL process also forms TFTs 612 and 616, with gate line 222 controlling TFT 612. An upper plate 762 of capacitor 614 can be formed during the SAIL process from the same metal layer that forms drain and source pads for TFTs 612 and 616. With this structure, the channel lengths and widths of transistors 612 and 616 can be tightly controlled. After the SAIL process, a passivation layer is deposited and an upper metal layer is patterned on top of the passivation layer. The upper metal layer includes data lines 282 with a conductive via to the drain of TFT 612, a bridge 782 electrically connecting the source of TFT 612 to upper plate 762. A bridge 786 connects upper plate 762 to gate 726 of TFT 616 through vias. A bridge 788 connects a ground line 724 to the source of TFT 616. An LED overlying pixel structure 700 connects to the drain of TFT 616. In an exemplary embodiment, the upper layer is a metal/PIN/metal stack that could be patterned to fabricate data lines 282 and LEDs 618.

Although the invention has been described with reference to particular embodiments, the description is only an example of the invention's application and should not be taken as a limitation. For example, although the specific embodiments of the invention described above are employed in displays similar fabrication techniques could be employed in other devices such as sensor arrays that may employ crossing circuit features over a large area. Various other adaptations and combinations of features of the embodiments disclosed are within the scope of the invention as defined by the following claims.

What is claimed is:

1. A device fabrication process comprising:
   depositing a plurality of thin film layers upon a substrate;
   forming a 3D template overlying the thin film layers;
   etching the 3D template and the thin film layers to form a plurality of gate lines and a plurality of transistors from the thin film layers, wherein the gate lines are respectively coupled to rows of the transistors;
   depositing an insulating layer on the gate lines and the transistors and exposing transistor source and drain contacts; and
   forming a plurality of column lines on the insulating layer, wherein the column lines are respectively coupled to columns of the transistors.

2. The process of claim 1, further comprising performing an in-line testing and repairing process before the step of depositing an insulator.

3. The process of claim 1, wherein the substrate is flexible.

4. The process of claim 1, wherein depositing the thin film layers comprises:
   depositing a conductive layer on the substrate;
   depositing a layer of gate dielectric on the conductive layer; and
   depositing one or more semiconductor layers on the layer of gate dielectric.

5. The process of claim 1, wherein the 3D template comprises:
   a first level including areas that define boundaries of the gate lines;
   a second level including areas that define boundaries of body regions of the transistors;
   a third level including areas that define boundaries of channel regions of the transistors; and
   a fourth level including areas that define boundaries of source and drain contact pads of the transistors.

6. The process of claim 1, wherein forming the 3D template comprises imprinting a polymer material on top of the thin film layers.

7. The process of claim 1, wherein etching the 3D template and the thin film layers further forms circuitry for operation of a display.

8. The process of claim 1, wherein forming the column lines comprises a process selected from a group consisting of screen printing, inkjet printing, and masking and etching of a deposited layer.

9. The process of claim 1, further comprising forming pixel electrodes on the insulating layer and vias through the insulating layer connecting the pixel electrodes to the transistors.

10. The process of claim 1, wherein the 3D template includes three different levels.

11. The process of claim 1, wherein the 3D template includes four different levels.

12. The process of claim 5, wherein the body regions of the transistors overlie the gate lines.

13. The process of claim 9, wherein the pixel electrodes overlie the gate lines.

14. The process of claim 9, further comprising:
   testing for shunt defects in the thin-film transistors; and
   cutting a neck portion of one of the column lines to thereby isolate a continuous portion of the column line from one of the thin-film transistors that the testing indicates has a shunt defect.

15. A device fabrication process comprising:
   depositing a conductive layer upon a substrate;
   depositing a first semiconductor layer overlying the conductive layer;

forming a 3D template overlying the first semiconductor layer;

etching the 3D template, the conductive layer, and the first semiconductor layer to form a plurality of gate lines from the conductive layer and form a plurality of transistors containing regions that are formed from the first semiconductor layer and overlie the gate lines, wherein the gate lines are respectively coupled to rows of the transistors;

depositing an insulating layer on the gate lines and the transistors and exposing transistor source and drain contacts; and forming a plurality of column lines on the insulating layer, wherein the column lines are respectively coupled to columns of the transistors.

16. The process of claim 15, further comprising depositing a gate dielectric layer between the conductive layer and the first semiconductor layer.

17. The process of claim 15, wherein the regions of the transistors formed from the first semiconductor layer include body regions of the transistors.

18. The process of claim 15, wherein the regions of the transistors formed from the first semiconductor layer include channel regions of the transistors.

19. The process of claim 15, further comprising:

depositing a second semiconductor layer on the first semiconductor; and etching portions of the second semiconductor layer that are exposed by etching of the 3D template, the etching of the second semiconductor layer leaving source and drain regions of the transistors.

* * * * *